(12) United States Patent
Jenau et al.

(10) Patent No.: US 7,084,616 B1
(45) Date of Patent: Aug. 1, 2006

(54) METHOD AND DEVICE FOR MEASURING AN ELECTRICAL VOLTAGE

(75) Inventors: Frank Jenau, Cottbus (DE); Harald Schwarz, Cottbus (DE)

(73) Assignee: Kommanditgesellschaft Ritz Messwandler GmbH & Co., Hamburg (DE)

( * ) Notice: Subject to any disclaimer, the term of this patent is extended or adjusted under 35 U.S.C. 154(b) by 0 days.

(21) Appl. No.: 09/380,410

(22) PCT Filed: Mar. 5, 1998

(86) PCT No.: PCT/DE98/00683

§ 371 (c)(1),
(2), (4) Date: Oct. 28, 1999

(87) PCT Pub. No.: WO98/39662

PCT Pub. Date: Sep. 11, 1998

(30) Foreign Application Priority Data

Mar. 5, 1997 (DE) .......................... 197 16 477

(51) Int. Cl.
*G01R 31/00* (2006.01)
*G01R 31/308* (2006.01)
*G01D 5/34* (2006.01)
*G01J 1/34* (2006.01)

(52) U.S. Cl. .................. 324/96; 324/753; 250/231.1; 250/227.21

(58) Field of Classification Search ............ 324/96, 324/753; 250/231.1, 227.21
See application file for complete search history.

(56) References Cited

U.S. PATENT DOCUMENTS

| | | | | |
|---|---|---|---|---|
| 4,631,402 A | * | 12/1986 | Nagatsuma et al. | 250/231.1 |
| 4,968,881 A | * | 11/1990 | Takahashi et al. | 250/227.21 |
| 5,053,617 A | * | 10/1991 | Kakizaki et al. | 250/227.21 |
| 5,446,381 A | * | 8/1995 | Okajima et al. | 324/96 |

FOREIGN PATENT DOCUMENTS

| | | |
|---|---|---|
| DE | 21 31 224 | 12/1972 |
| DE | 28 45 625 | 4/1980 |
| DE | 30 39 136 A1 | 7/1981 |
| DE | 41 00 054 A1 | 7/1991 |
| DE | 44 16 298 A1 | 11/1995 |
| DE | 44 36 181 A1 | 4/1996 |
| DE | 44 36 454 A1 | 4/1996 |

OTHER PUBLICATIONS

Schwab: "Hochspannungsmesstechnik", Zweite, Neubearbeite Und Erweiterte Auflage, Springer–Verlag Berlin Heidelberg New York 1981.
Hirsch: "Polarimetrische Faseroptische Stromwander", Dortmund 1991.

* cited by examiner

*Primary Examiner*—N. Le
*Assistant Examiner*—Anjan K. Deb
(74) *Attorney, Agent, or Firm*—Michael J. Striker

(57) ABSTRACT

A method and device for measuring electrical voltage allow measurement under open-air conditions including high-voltage and very high voltage. Influence of temperature changes on electrical and optical parameters of the device are reduced by using light sources, at least one optical transmission path, at least one sensor element with at least one active sensor part made up of several sensor crystals and evaluation by Pockel's effect using optical activity in a crystal. Measurement light generated by a light source penetrates an active sensor, which has at least two voltage comprising evaluation means for evaluating the polarization state of measurement light traversed through sensor crystals wherein the evaluation means is used with a component assembly for scaling and multiplying input signal by a factor generated by a function unit, its input quantity representing the difference between a reference signal and a factored output signal wherein the function unit performs integration.

22 Claims, 4 Drawing Sheets

METHOD AND DEVICE FOR MEASURING AN ELECTRICAL VOLTAGE

BACKGROUND OF THE INVENTION

The invention concerns a method and a device for optical measurement of an electrical voltage, preferably a high voltage.

Conventional voltage transformers used for measuring high voltages in power technology installations are based on an inductive measurement principle; capacitive voltage dividers may also be used in addition. In conventional transformers, expenditure on insulation increases at a disproportionately high rate in relation to the transmission voltage of the power supply network (see A. J. Schwab, "Hochspannungsmeβtechnik [High-Voltage Measuring Techniques]". Electromagnetic compatibility (EMC) has gained in importance in the course of increasing digitalization of the measuring technology following the transformers, wherein this measuring technology generally has lower interference thresholds than conventional analog measurement technology. Because of the inductive-capacitive coupling of the primary plane (supply side) to the secondary plane (measurement and control side) in conventional voltage transformers, their use in connection with digital network technology turns out to be problematic as concerns EMC (see H. Hirsch, "Polarimetrische faseroptische Stromwandler [Polarimetric fiber-optic current transformers]"). Compared to conventional transformers, little raw material is used owing to the small size of optical component assemblies. Optical transformers do not require any oil for insulation in principle, so that the risk of contamination of adjoining soil with oil in the event of a transformer explosion due to defect on the network side or device side is nonexistent.

Optical measuring methods in which electrical fields and electrical voltages are measured via the Pockels effect in electro-optical crystals are already generally known from different references. In this connection, the physical properties of an electro-optical medium change as a function of the electrical field strength in such a way that the polarization state of the optical wave propagating through the sensor medium is influenced by a linear birefringence induced by the electrical field. With the help of an optical arrangement comprising a polarizer, a delay element, an electro-optical material and an analyzer, in combination with electronic evaluating means, the measurement signal can be acquired for determining the electrical voltage transverse or parallel to the propagation direction of the optical wave. In order to make it possible to separate the useful quantity—electrical voltage—from the interference quantities—damping along the optical signal path which is not constant over time, temperature dependencies on parameters of the optical components employed—the optical signal path is divided into more than one partial beam. The partial beams are guided to separate receivers via different optical elements and the detected signals are, if necessary, subjected to digital signal processing after suitable processing through analog electronic means.

In DE 4436454, polarized measurement light is guided through a Pockels sensor device under the influence of the alternating field or AC voltage to a beam splitter which splits the optical wave into two different polarization planes. The method indicated in the embodiment form makes use of the transverse electro-optical effect (FIG. 1) for measuring the electrical field. The method is suitable for measurement of voltages which drop transversely across the sensor crystal. It is possible to adapt the measurement range by changing the crystal length, but the maximum measurable voltage is limited by the electrical strength of the sensor crystal. Due to the fact that the crystal dimensions are limited in practice, the measurement of high voltages by means of the transverse electro-optical effect is very uneconomical in technical respects; however, the measurement of "small" voltages below the electrical strength of the crystal material through an increase in sensitivity by lengthening the crystal is useful.

DE-OS 4416298 describes an embodiment form of the measurement process and the device for carrying out the process which make use of the longitudinal electro-optical effect. An electric voltage to be measured generates an electrical field in the crystal whose flux lines run parallel to the propagation direction of the measurement light. Due to the maximum technically possible crystal dimensions and the limited electrical strength in this connection, there is a considerable increase in expenditure on insulation for measurements of electrical voltages in the range of the maximum electrical strength of the arrangements.

German Patent 4100054 proposes an optical measurement transducer which supplies a measurement for electrical current by determining the magnetic field and, by means of an installed capacitive divider, makes use of the voltage drop across a partial capacitance as a measurement for electrical voltage. The electrical voltage is exactly determined only when the indicated splitting ratio determined by overvoltage capacitance and undervoltage capacitance remains constant. Since a spatially expanded undervoltage capacitance is used, the capacitance can be influenced by field distortion, so that the splitting ratio of the measurement transducer is changed. In general, constant field distributions cannot be assumed in practice.

DE-EB 3404608 describes a device for optical measurement of the electrical field strength which supplies, via a transmission element, an optical wave of a sensor device for an electrical field which changes the degree of modulation of the optical wave depending on the electrical field strength. It is noted that the utilized sensor crystals from groups 23 and 43m exhibit a limited dependency of the optical effect on temperature, but there is no complete compensation of the temperature influence.

A device for measuring a voltage and an electrical field using light is indicated in DE Patent 3039136. The patent describes the use of, e.g., a bismuth-germanium oxide crystal for voltage measurement and field measurement. It is indicated that the temperature dependencies of the material-specific constant $V_n$ can be assumed at about 0.01% /K. Consequently, in a temperature range of $\Delta T=100K$ the error can amount to 1%. For applications with higher accuracies, it is necessary to compensate for the temperature characteristic not only of the sensor crystal, but also of the delay plate.

DE-EB 2845625 describes an arrangement for electro-optical voltage measurement which makes use of the longitudinal linear electro-optical effect of a piezoelectric fiber and in which there is effected an integration of the optical effects of the field strength distribution along the fibers by means of the spatial dimensioning of the crystal fibers. According to the state of the art, a crystal fiber of this type is not currently commercially available, so that this method of voltage measurement has not been successful in practice in technical respects relating to large-series manufacture.

DE-EB 2131224 discloses a device for measurement of voltages of high-voltage conductors in which it is indicated that the electrical field proportional to the voltage to be measured changes the polarization plane of polarized light which is coupled into a light waveguide. In a suggested arrangement, the light waveguide is guided along a curvy path in order to increase the effect. A high temperature dependency of the measurement signal caused by the linear birefringence of the light waveguide induced by bending would be expected in this embodiment.

DE-EB 1591976 describes an electro-optical voltage reducing device and its application for measuring voltages. In this case, the polarization of a light bundle traversing a quantity of electro-optical cells which are electrically connected in series is changed and read out by a Pockels cell via a compensating circuit. In principle, the described arrangement is a resistive-capacitive splitter whose voltage drops across partial capacitances are read out optically. The method has the disadvantage that temperature dependencies of the optical elements are not compensated and that the suggested device is uneconomical in technical respects and is accordingly expensive to produce because the cost of the voltage divider is added to that of the optical construction. Further, the compensation circuit necessitates supply of a secondary electrical voltage.

DE 4436181 A1 discloses a method and a device for measuring an electrical AC quantity with temperature compensation through fitting. A suggesting scaling circuit takes the ratio of AC signal component to DC signal component of the intensity signal of the optical wave detected by the receivers. A divider is used to carry out this function. No steps are indicated for suppressing the effects of tolerances of the structural component parts in the scaling stage.

SUMMARY OF THE INVENTION

Therefore, it is the object of the invention to provide a method and a device for measuring an electrical AC voltage by means of the electro-optical effect in which the measurement can be carried out under open-air conditions also in the high-voltage and very high-voltage planes in a technically simple manner. The method and the device will contain steps for reducing the effects of temperature changes on optical and electrical parameters of the device. A modular, scalable construction is aimed for in order to reduce cost and increase production piece numbers.

This object is met in that a method and a device for measuring an electrical AC voltage are proposed which make use of at least one sensor element and evaluating means by utilizing the Pockels effect and using at least one light source and at least one optical transmission path. The sensor element contains at least one active sensor part. The voltage present at the sensor element drops at a quantity $N_{SA}$ ($N_{SA}$ is greater than or equal to 1) of active sensor parts, so that the partial voltage(s) $U_{SA,1}$... $U_{SA,NSA}$ dropping at the active sensor part(s) is (are) measured and available for further processing. A quantity $N_{SE}$ ($N_{SE}$ is greater than or equal to 1) of sensor elements is used, so that the sum of the partial voltages $U_{SE,1}$... $U_{SE,NSE}$ dropping at them is available and is used for determining the total voltage to be measured. The partial voltages $U_{SE,1}$... $U_{SE,NSE}$ are again composed of a sum of partial voltages $U_{SA1}$... $U_{SA,NSA}$.

Measurement light generated by a light source penetrates an active sensor part comprising at least two sensor crystals at which an electrical voltage drops. After the measurement light has traversed the sensor crystals, its polarization state is further used for processing information which, after suitable evaluation, represents a measurement for the electrical voltage dropping over the sensor crystals, wherein the selected quantity $N_{SK}$ of sensor crystals on the measurement path is sufficiently large with respect to the inhomogeneity of the electrical field distribution and the length of the measurement path is in the same order of magnitude as the length of the path along which the voltage to be measured drops. The active sensor part contains a least one temperature-dependent optical element which is optically active. The temperature-dependency of the optical activity is made available as a measurement for the temperature prevailing at the temperature-dependent optical element to assess the measurement values. The active sensor part is constructed in such a way that the sensor crystals contained therein are penetrated by an individual light beam one after the other in the same crystallographic orientation, the results of the electro-optical effects in the individual crystals are summed, and the sum values are available as a basis for determining the voltage present at the active sensor part and are applied for this purpose. The active sensor part has a carrier which serves to hold and align the crystals that are used.

The optical waves transmitted by the active sensor parts are detected and, as signal I, are each converted to a signal $I_N$ via a component assembly contained in evaluating means intended for this purpose in that the signal I comprises and AC component $I_{AC}$ as characteristic quantity which changes over time with the frequency of the voltage to be measured, whose time constant is designated by $T_{AC}$, and the change in the DC component $I_{DC}$ is described as another characteristic quantity of signal I with constant $T_{DC}$, wherein time constant $T_{DC}$ is appreciably greater than $T_{AC}$ and the scaling is effected by multiplying signal I by a factor K in such a way that the DC component of $I_N$ takes on the predetermined value of a reference signal $V_{ref}$, and factor K which is used in preparation is determined in a closed control loop. Instead of the DC component, the peak value can also be detected and used further.

A suitable device for measuring electrical voltage in which the electrical voltage is an AC quantity has at least one light source, at least one optical transmission path, at least one active sensor part and evaluation means use of the Pockels effect. The active sensor part has at least two electro-optical sensor crystals which are penetrated by a polarized measurement light, wherein a temperature-dependent optical element can follow the sensor crystals. The crystals penetrated by a polarized measurement light and the temperature-dependent optical element preferably comprise $Bi_4Ge_3O_{12}$, $Bi_4Si_3O_{12}$ or $B_{12}GeO_{20}$, $Bi_{12}SiO_{20}$ or compounds of crystal group 43 m or 23.

The active sensor part comprises a plurality of sensor crystals which are directed successively, can be penetrated by an individual light beam, have the same crystallographic orientation and are arranged in or at an appropriate carrier so as to be adjustable for orientation relative to one another in the direction of the light radiating through them. These sensor crystals are preferably axially aligned.

The sensor element contains a device which makes it possible to arrange one or more active sensor parts in such a way that the voltage present at the sensor element drops in partial voltages at the active sensor par(s) and the sum of the partial voltages equals the applied voltage. Sensor elements can be combined by holding elements and field-control elements in such a way that the voltage applied thereto drops at the individual sensor elements in partial voltages.

The device contains, as evaluating means, at least one component assembly by means of which the scaling is carried out by multiplying the input signal by a factor which is generated by a function unit, its input quantity representing the difference between a reference signal and the factored input signal. An integrator, a low-pass filter or a peak value rectifier can advantageously be used as a function unit.

The advantages of the invention consist in that the device according to the invention has a modulator construction, so that the device is to be adapted for voltage measurement in different voltage planes without the need for basic design changes. An economical voltage transformer can be realized by means of this step by increasing the piece number of an active sensor part. A further advantage of the invention consists in that the discrete summing of the electrical field strength for approximating the applied electrical voltage is carried out by using a large number of sensor crystals. Accordingly, the use of long crystal rods to which the voltage to be measured is applied can be dispensed with. Therefore, a reduction in costs can be expected because of the smaller crystal volumes. The use of a temperature-dependent optical element as a temperature sensor makes it possible to compensate for temperature-dependent effects.

A control loop is proposed in the scaling stage of the evaluating circuit for carrying out scaling; this control loop regulates structural component part tolerances through the use of feedback, in contrast to methods without feedback. This control loop can advantageously control subsequent analog and digital circuits.

A further advantage of the solution according to the invention consists in that a discrete voltage divider for controlling the voltage drop in the suggested optical transducer is not needed. The electrical voltage is determined in accordance with its definition by integrating the electrical field strength components on the measurement path.

BRIEF DESCRIPTION OF THE DRAWINGS

The invention will be described more fully in the following in an embodiment example. Shown in the accompanying drawings are.

DESCRIPTION OF PREFERRED
EMBODIMENTS

Figure 1:
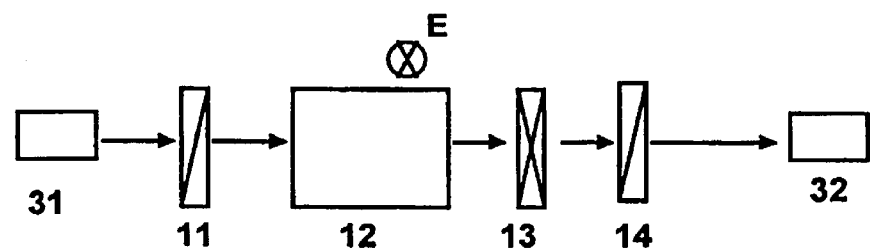
FIG. 1 the principle of a Pockels cell based on the transverse electro-optical effect.
Figure 2:
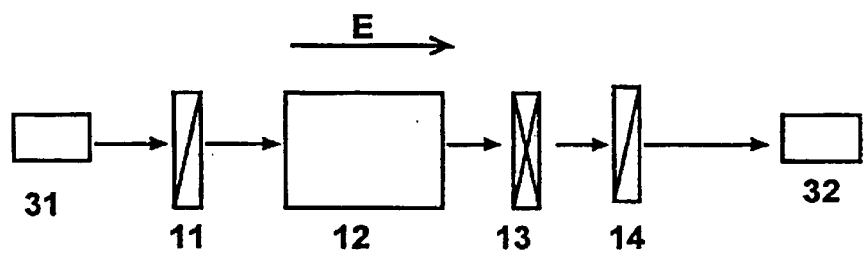
FIG. 2 principle of a Pockels cell based on the longitudinal electro-optical effect.

As is known, the measurement of the electrical field can be carried out with a Pockels cell. FIGS. 1 and 2 show the basic construction of a Pockels cell. A light source 31 emits an optical wave which is guided via a polarizer 11, an electro-optical element 12, a delay element 13 and an analyzer 14, to an optoelectronic transducer 32. When a crystal without natural linear birefringence is used as electro-optical element 12, the operating point of the arrangement should be set at a delay of a quarter wavelength to ensure maximum sensitivity and linearity through the use of a delay plate 13. When the transverse electro-optical effect is used (FIG. 1), the light propagation direction and the modulating electrical field are perpendicular to one another. In order to make use of the longitudinal electro-optical effect (FIG. 2, electrical field and light propagation direction extend parallel to one another), the electro-optical crystal 12 is oriented in such a way that the coupled-in linearly polarized optical wave propagates along a main axis in the sensor crystal 12 and the polarization plane of the optical wave is oriented at a 45-degree angle to the other electro-optically characterized axes of the crystal in the presence of field E. The analyzer 14 converts the optical signal which is phase-modulated by the present electrical field into an intensity-modulated signal. It is possible to determine the field strength E from the intensity-modulated signal made available by the receiver 32 via evaluating means.

Figure 3:
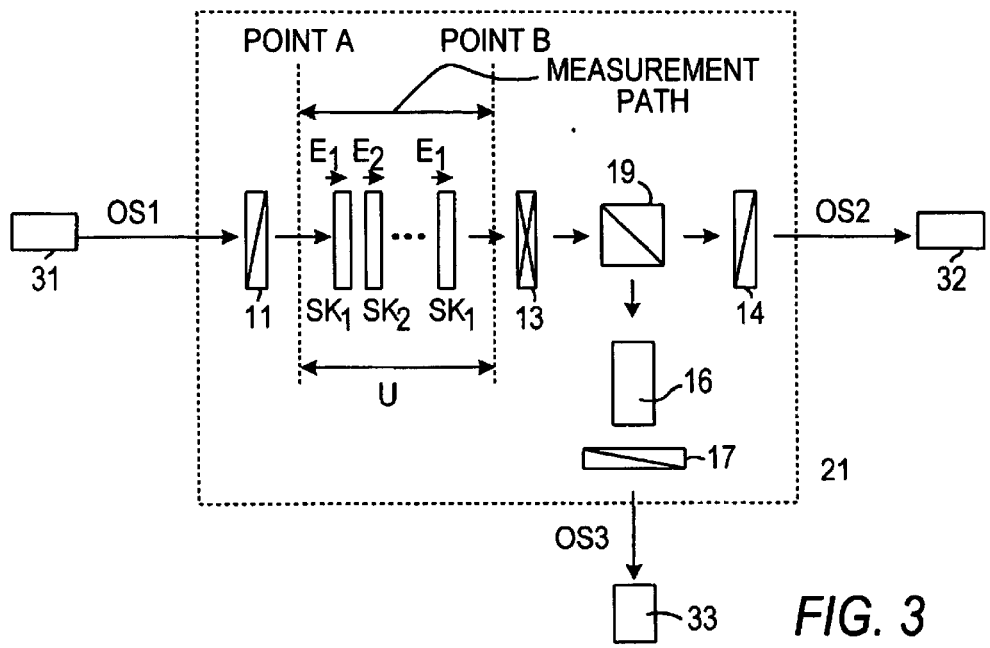
FIG. 3 principle of an expanded Pockels cell for voltage measurement and temperature detection.

FIG. 3 shows the principle of the expanded Pockels cell used in the invention. In contrast to FIGS. 1 and 2, this Pockels cell comprises a plurality of sensor crystals $SK_i$ where i=1,2 ... N $_{SK}$, $N_{SK}$ is greater than or equal to zero) and comprises, in addition, a beam splitter 19, a temperature-dependent element 16, an analyzer 17 and a receiver 33, The connection of the light source 31 to the active sensor part 21 represents the optical transmission path OS1, the connections from 21 to the electro-optical transducers 32 and 33 are realized by means of the optical transmission paths OS2 and OS3, respectively. The optical wave is modulated by the active sensor part 21 at discrete locations of the sensor crystals $SK_i$ through the locally prevailing field strength $E_i$. After traversing the beam splitter 19, one partial wave is supplied via a temperature-dependent optical element 16 to an analyzer 17 and a receiver 33. The other partial wave directly strikes the analyzer 14 and a receiver 32 after the beam splitter. When the Pockels cell works according to the longitudinal electro-optical effect, the individual modulations add up at the sensor crystals when the latter are arranged in the same crystallographic orientation. The sum of individual modulations results in a total phase delay Γ of two orthogonal partial waves.

Figure 4:
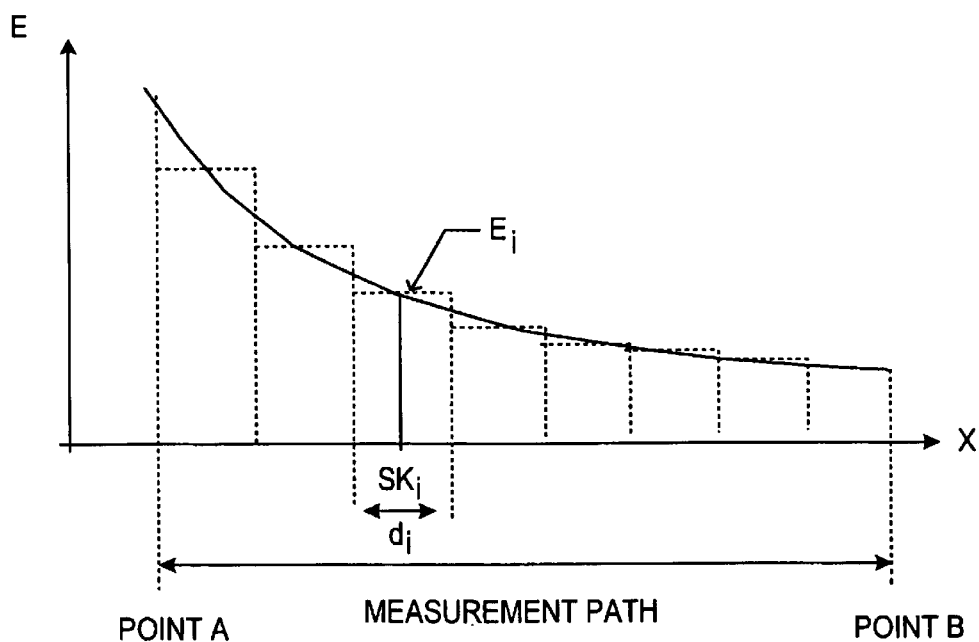
FIG. 4 use of a plurality of sensor crystals for voltage measurement.

The voltage to be determined drops on the measurement path of the active sensor part between points A and B. The associated assumed field strength curve (solid line) is shown in FIG. 4 as a function of the measurement point. According to the definition for determining the voltage between points A and B, the integral of the field strength path product uses:

$$U_{A,B} = \int_A^B \vec{E} d\vec{l} \qquad (1)$$

When the field strength curve is approximately by a step function with a quantity of $N_{SK}$ steps, $U_{A,B}$ changes to:

$$U_{A,B} = \sum_{i=1}^{NSK} E_i \cdot d_i, \qquad (2)$$

where $E_i$ represents the constant field strength at the sensor crystal $SK_i$ at step i with width $d_i$. The transition from equation (1) to equation (2) is possible on condition that exclusively the field strength component E in path direction dl has an influence on the value of the integral. If the widths of steps $d_i$ are identical to a constant d and the lengths $l_i$ of the sensor crystals are likewise equal to a constant I, equation (2) results, by expansion, in equation (3):

$$U_{A,B} = \frac{d}{l}\sum_{i=1}^{NSK} E_i \cdot l_i \quad (3)$$

When the longitudinal electro-optical effect is used, the phase delay of two orthogonal optical partial waves is proportional to $E_i$ and $I_i$ (see A. Yariv, P. Yeh, "Optical Waves in Crystals"):

$$\Gamma_i \propto E_i \cdot I_i \quad (4.1)$$

so that, in combination with (3), $U_{A,B}$ is proportional to the sum of the partial phase delays:

$$U_{A,B} \propto \sum_i \Gamma_i \quad (4.2)$$

When the partial phase delays brought about by the individual sensor crystals are summed according to the following equation:

$$\Gamma = \sum_i \Gamma_i \quad (5)$$

the total phase delay $\Gamma$ according to equations (4.2) and (5) is proportional to the voltage $U_{A,B}$ to be measured.

Therefore, with a sufficiently large quantity of sensor crystals, the determination of the electrical voltage by calculation of the path integral of the electrical field strength can be traced to a summing of discrete field strength path products. The more sensor crystals are used, the more exactly the summing approximates the integral. However, this also results in increased cost for the crystals and increased loss caused by surface reflections. In practice, costs and measuring accuracy are to be optimized.

The second optical wave coupled out by the beam splitter traverses a temperature-dependent optical element which is optically active. By means of this arrangement, a correction factor can be obtained which compensates for the temperature-dependent errors of the linear birefringence in the sensor crystals and in the delay plate.

Figure 5:
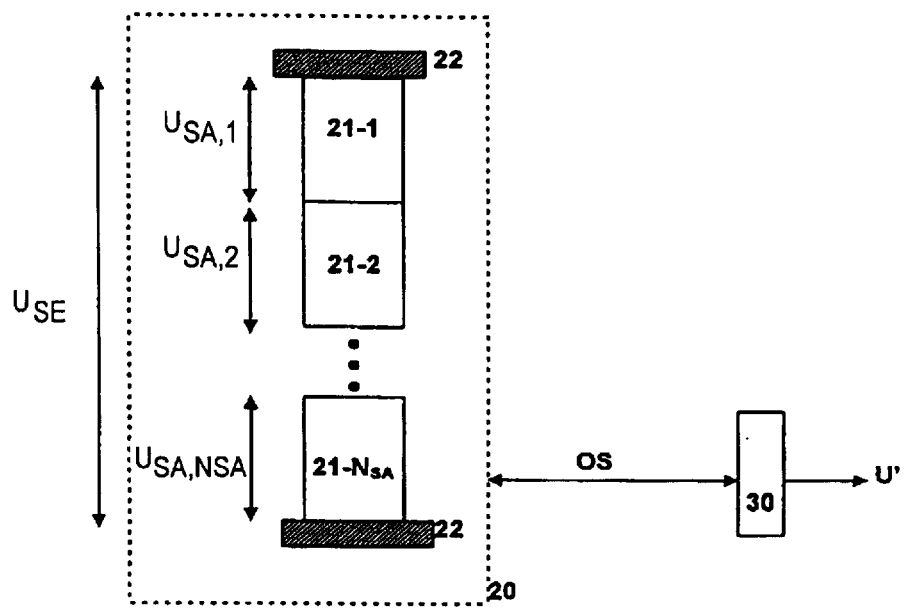
FIG. 5 basic construction of the device for measuring a voltage.

FIG. 5 shows the schematic construction of the device for measuring voltage comprising light sources and evaluating means 30 and a sensor element 20 which comprises a quantity $N_{SA}$ of active sensor parts 21-X and holding and field control elements 22. The optical transmission paths between the sensor element 20 and evaluating device 30 are designated inclusively by OS. Optical waves are supplied to the optical sensor element along the transmission path OS. At least two optical waves are guided back from the sensor element 20 to the evaluating means 30 via the transmission path OS. The evaluating means generate a measurement U' for the sum of the voltages $U_{SA,1} \ldots U_{SA,NSA}$ present at the active sensor parts 12-1 . . . 21-$N_{SA}$. The voltage U' is proportional to the total voltage U.

Figure 6:
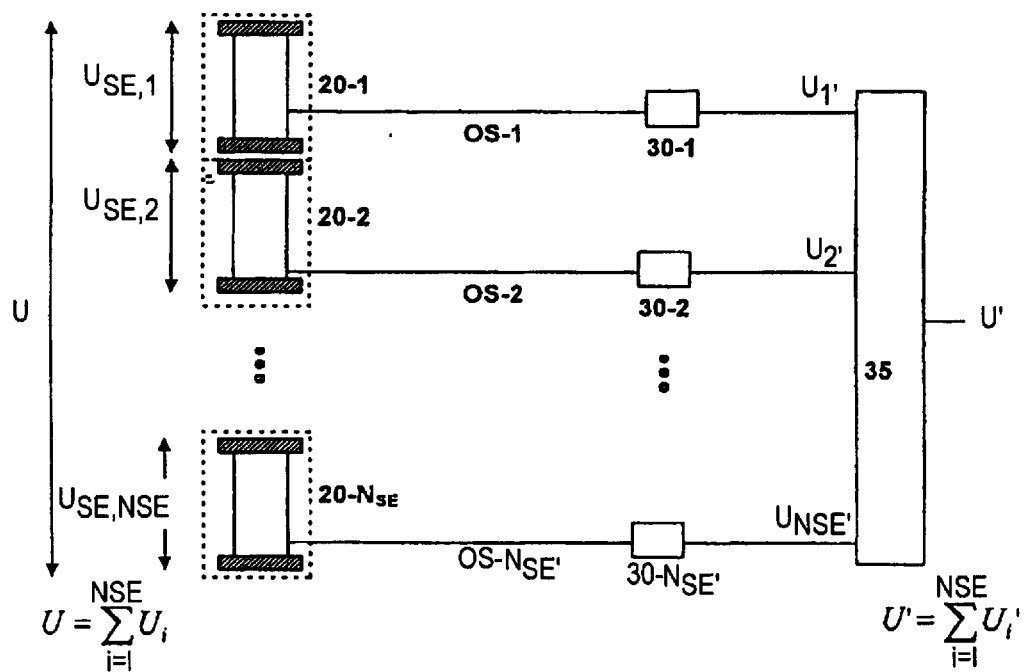
FIG. 6 basic modular construction of the device for adapting the voltage plane.

FIG. 6 shows an example for the modulator construction for adapting the voltage plane when each of the sensor elements 20-X (X=1,2. . . $N_{SE}$) contains exactly one active sensor part 21, so that $N_{SE}$ is equal to $N_{SA}$ in this case. The sensor elements 20-X are arranged in such a way that the partial voltages $U_1', U_2', \ldots U_{NSE}'$ of the sensor elements determined in the evaluating means 30-X give a measurement U' proportional to the total system voltage U by summing in until 35. Unit 35 can be part of the evaluating means 30 or a unit composed of 30.

In this embodiment example, $Bi_4Ge_3O_{12}$, belonging to class 43 m of the cubic crystal system, will be considered as sensor crystal. The crystal has no natural linear birefringence and is not optically active. Due to the absence of optical activity, a large number of sensor crystals of the same kind can be arranged one behind the other in a simple manner as regards construction, so that the effects of the longitudinal Pockels effect are summed in the form of induced linear birefringence in the individual crystal $\Gamma_i$ to form a total phase delay $\Gamma$ of the propagating orthogonal partial waves. When the polarizer 11 in FIG. 3 is oriented at an angle of 45° to the electro-optically characterized axes of the sensor crystals, all of which have the same orientation, and the analyzer 14 is arranged so as to be crossed with the input polarizer, the intensity $I_i$ can be detected at the receiver 32 according to the following equation:

$$I_1 = I_{1,DC}(1 + \sin(\Gamma)), \quad (6),$$

where $\Gamma$ is the phase delay due to the Pockels effect between the optical partial waves that are polarized along the first and second electro-optically characterized axes and the light propagation takes place in the direction of the third electro-optically characterized axis. The DC component of the intensity $I_1$ detected at the receiver is designated by $I_{1,DC}$. The value $\Gamma$ can be calculated from the sum of the partial phase delays $\Gamma_i$ at the individual sensor crystals, wherein $N_{SK}$ shows the quantity of sensor crystals used.

$$\Gamma = \sum_{i=1}^{NSK} \Gamma_i \quad (7)$$

According to the longitudinal electro-optical effect, the partial phase delays $\Gamma_i$ of the individual sensor crystals gives:

$$\Gamma_i = \frac{2\pi}{\lambda_0} \cdot n_0^3 \cdot r_{41} \cdot E_{z,i} \cdot l_i, \quad (8)$$

where:
$n_0$ is the index of refraction,
$\lambda_0$ is the wavelength of the optical wave,
$r_{41}$ is the electro-optical constant,
$E_{z,i}$ is the electrical field component in the propagation direction of the optical wave in crystal i,
$l_i$ is the length of the light path in the electro-optical crystal.

The second partial beam in FIG. 3 is guided via a temperature-dependent optical element 16 and via an analyzer 17 to a receiver 33. When $Bi_{12}GeO_{20}$, for example, is used as temperature-dependent optical element 16, a measurement can be determined for the temperature by making use of the temperature dependency of the natural optical activity. For this purpose, the polarization plane of a continuous optical wave is rotated by $\Delta\theta$ during a change in temperature of $\Delta T$. The scaled optical intensity $I_2$ can be detected at the receiver 33 with the DC component $I_{2,DC}$ according to:

$$I_2 = I_{2,DC}(1 + \sin(\Gamma) \cdot \sin(2 \cdot \theta)), \quad (9)$$

wherein the angle θ is composed of the rotation of the polarization plane by the optical activity at reference tem perature $\theta_0$ and the proportion $\Delta\theta$ caused by changes in temperature.

$$\theta = \theta_0 \Delta\theta, \quad (10)$$

The analyzer is oriented by an angle of $45°+\Delta\theta_{max}$ to the angle $\theta_0$. Due to the additional rotation by $\Delta\theta_{max}$, the change of $\Delta\theta$ within the interval $[-\Delta\theta_{max}, +\Delta\theta_{max}]$ always leads to a modulation of the output signal $I_2$ without a change in sign.

In order to compensate for damping influences on the optical transmission path between the light source and the receiver, it is advantageous when the signals $I_1$ and $I_2$ are divided into the DC component and AC component and scaling is carried out as prescribed by the following equations:

$$I_{1N} = \frac{I_{1,AC}}{I_{1,DC}} = \sin(\Gamma) \quad (11)$$

$$I_{2N} = \frac{I_{2,AC}}{I_{2,DC}} = \sin(\Gamma) \cdot \sin(2 \cdot (\Delta\theta + \Delta\theta_{max})) \quad (12)$$

In the equations shown above, $\Gamma$ is an AC signal in the frequency range of 20 Hz to 20 kHz; on the other hand $\Delta\theta$ changes only "slowly" in the range of the thermal time constant of the measuring device in the frequency range below 20 Hz.

Integrating signals $I_{1N}$ and $I_{2N}$ over a time interval $\tau$ with respect to amount ($\tau$ should be appreciably less than the thermal time constant and appreciably greater than the period of the lower boundary frequency of the AC signal $\Gamma$) and dividing them gives the quantity T21 according to the following equation.

$$T21 = \frac{\int_{t=t0}^{t0+\tau} |I_{2N}| dt}{\int_{t=t0}^{t0+\tau} |I_{1N}| dt} = \sin(\Delta\theta + \Delta\theta_{max}), \quad (13)$$

For changes of $\Delta\theta + \Delta\theta_{max} \ll 1$, the sine function can be approximated linearly by its argument. Equation (13) gives:

$$\Delta\theta = T21 \Delta\theta_{max} \quad (14)$$

It is possible to determine temperature by means of $\Delta\theta$ because $\Delta\theta$ changes approximately linearly depending on the temperature and an inverse function can be determined in a mathematically definite manner in the interval in question. It is possible to correct the temperature characteristic of the signal by means of this determined measurement for the change in temperature with respect to the reference temperature. An output signal A which can be corrected by factor $K_\tau$ for temperature compensation is obtained by forming the arc sine of $I_{1N}$. The factor $K_\tau$ must be known by means of calibration.

$$A = K_\tau \cdot \alpha \sin(I_{1N}) \quad (15)$$

The signal A is accordingly proportional to the total phase delay $\Gamma$ of the sensor element and to the sum of the electrical field strengths prevailing at the measurement locations.

A precondition of the indicated process is that exclusively the electrical field strength component in the path direction has an influence on the value of the integral from (1) in the transition from the defining equation of the electrical voltage (1) to equation (2). When the direction of light propagation in the sensor crystal is selected parallel to the direction of the integration path and the measured light propagates along an optical main axis in the sensor crystal, then, when a cubic crystal is used, only the electrical field component has an influence on the sum in equation (2) which is directed parallel to the propagation direction of the measurement light. In order to show this, the indicatrix is used as a descriptive model of the index of refraction depending on the light propagation direction. The mathematical formulation of the indicatrix (see A. Yariv, P. Yeh, "Optical Waves in Crystals") gives:

$$\frac{1}{n_0^2}(x^2 + y^2 + z^2) + 2r_{41} \cdot (E_x \cdot y \cdot z + E_y \cdot z \cdot x + E_x \cdot x \cdot y) = 1, \quad (16)$$

wherein direction x is consistent with crystal direction <100>, y is consistent with <010> and z is consistent with <001>. With consideration to the light propagation in direction z, a section of the indicatrix in the x-y plane is carried out in the coordinate origin, which can be described mathematically by the condition z=0.

In this case, the indicatrix changes to $$\frac{1}{n_0^2}(x^2 + y^2) + 2r_{41} \cdot E_x \cdot x \cdot y = 1. \quad (17)$$

After carrying out a coordinate transformation from (x,y) to $(x^1, y^1)$ with $$x = (x' - y')\frac{1}{\sqrt{2}} \quad (18)$$

$$y = (x' + y')\frac{1}{\sqrt{2}} \quad (19)$$

the indicatrix from (17) can be described by $$\frac{x'^2}{n_{x'}^2} + \frac{y'^2}{n_{y'}^2} = 1, \quad (20)$$

with the refractive indexes $n_{x'}$ and $n_{y'}$ along the x' direction and y' direction (ignoring terms with higher powers of $r_{41}$) according to $$n_{x'} = n_0 - \frac{1}{2}n^3 r_{41} E_x \quad (21)$$

$$n_{y'} = n_0 + \frac{1}{2}n^3 r_{41} E_x \quad (22)$$

It is shown in (21) and (22) that in case of light propagation in the z-direction along a main axis in the crystal the indicatrix is influenced exclusively by the electrical field component in the propagation direction. In this case, other field components do not influence the indicatrix and accordingly the phase delay, which is proportional to the difference of $n_{x'}$ and $n_{y'}$, as measurement of the local field strengths.

Accordingly, the signal A from (15) is proportional to the voltage $U_{A,B}$ which drops over the sensor crystals which are located on the measurement path of the active sensor part 21.

When the total voltage drop is distributed over a plurality of sensor elements (FIG. 6) in order to adapt the voltage plane, the summing of the partial voltages of the sensor elements leads again to the total voltage.

If the sensor element contains only one individual sensor crystal, no voltage is measured in this case, but only a field strength component which drops over the sensor crystal. The voltage sensor can be used as a sensor for an electrical field strength component.

Figure 7:
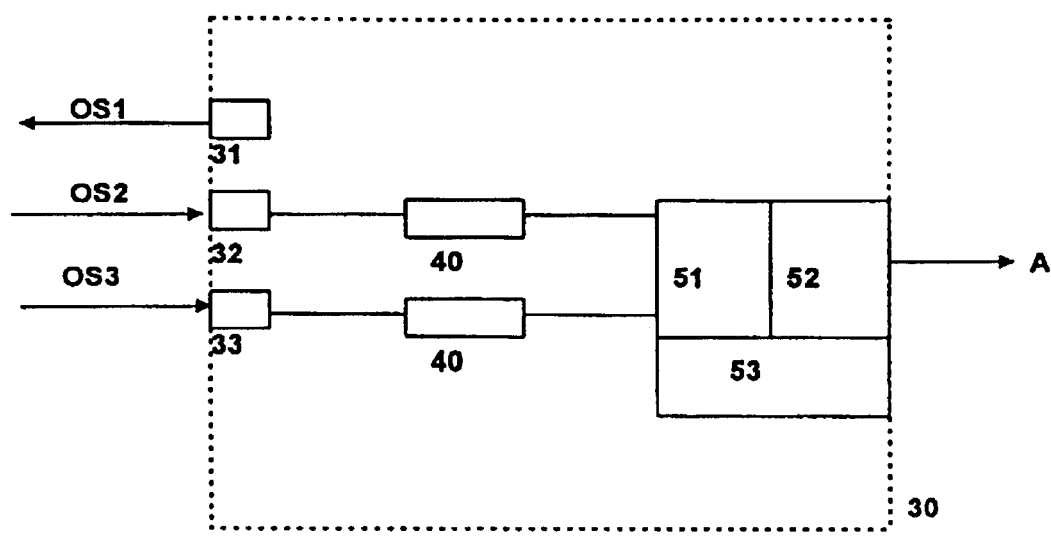
FIG. 7 basic construction of the evaluating means.
Figure 8:
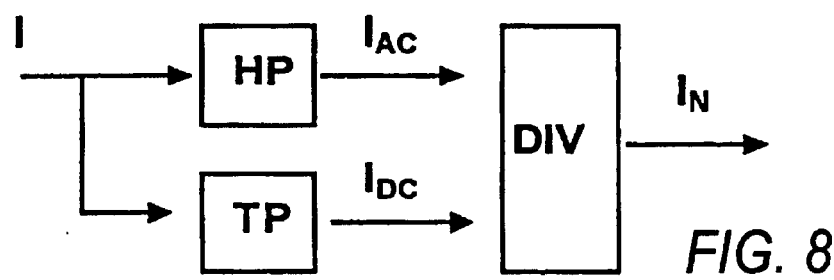
FIG. 8 conventional scaling of an optical signal by means of dividers.

FIG. 7 shows the evaluation means 30. They contain a light source 31 and at least two electro-optical transducers 32 and 33. The signals are pre-processed by component assemblies 40, digitized by a multi-channel A-D converter 51, processed in a computer 53 and made available as output quantity A via a D-A converter 52. The signal detected by receivers 32 and 33 is scaled in component assemblies 40, so that the following A-D converter is adequately controlled. For this purpose, an analog divider and an analog high-pass and low-pass or a subtracter as a substitute for a high-pass or low-pass which realizes the mathematical function directly as is shown by way of example in FIG. 8 are usually used. The scaling is usually used in the case of optical sensors which transmit, on an optical transmission path, an intensity-modulated signal undergoing a temporal change in optical damping. Further, the influence of the steepness of the receiver can also be eliminated. The circuit that is usually used has the disadvantage that the divider is no longer adequately controlled when there is an increase in damping on the optical transmission path between the light source and receiver or, on the other hand, can be overcontrolled when there is a decrease in damping on the optical transmission path. Therefore, errors can occur as a result of the electronics. A solution to this problem is offered by the use of a multiplier which is integrated in a feedback loop, so that tolerances of the structural component parts can be compensated by the control loop. It is necessary to compensate for tolerances because, in practice, there are no commercially available structural component parts which have a sufficient accuracy.

Figure 9:
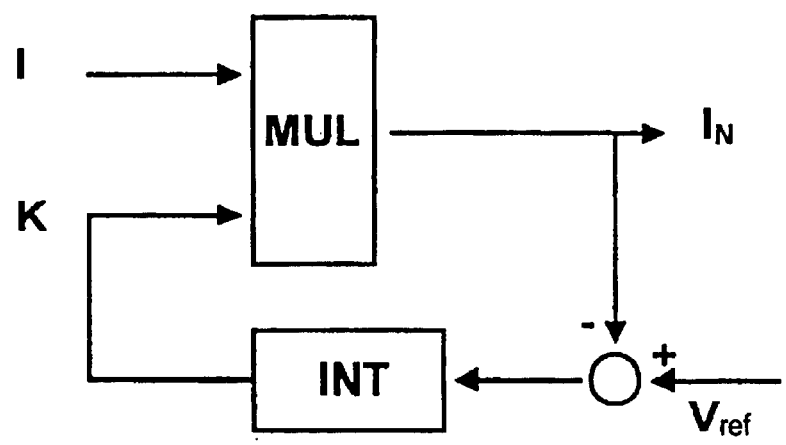
FIG. 9 scaling of the optical signal by means of regulated multiplier.

A basic construction of the circuit is shown in FIG. 9. The input signal I to be scaled is fed to a multiplier MUL as first factor, the second factor for the multiplier is obtained by the function unit INT from the output signal of the multiplier MUL and from a reference quantity $V_{ref}$. In one embodiment example, the function unit can be an integrator. In this case, the integrator generates a controlling variable as a second factor for the multiplier which regulates the DC component of the output quantity to the value predetermined by $V_{ref}$. The AC component of the signal I is scaled by the same factor determined by the regulation for the DC component. In another embodiment form, the function unit INT can be a peak value rectifier. In this, case, the input signal would be scaled by a factor so that the peak value of $I_N$ corresponds to the level $V_{ref}$. The multiplier can also be realized by another voltage-controlled coefficient element.

What is claimed is:

1. Method for measuring an electrical voltage, wherein the electrical voltage is an alternating quantity, making use of at least one sensor element (20) and evaluating means (30) by utilizing the Pockets effect and using at least one light source (31) and at least one optical transmission path (OS), wherein a measurement light generated by the light source (31) penetrates an active sensor part (21) comprising at least two sensor crystals at which an electrical voltage drops, and, after the measurement light has traversed the sensor crystals, the polarization state of the measurement light is further used for processing information which, after suitable evaluation, represents a measurement for the electrical voltage dropping over the sensor crystals, wherein the selected quantity of sensor crystals on the measurement path is sufficiently large with respect to the inhomogeneity of the electrical field distribution, and the length of the measurement path is in the same order of magnitude as the length of the path along which the voltage to be measured drops, wherein the evaluating means (30) is used with a corresponding component assembly (40) by means of which scaling is carried out by multiplying the input signal by a factor which is generated by a function unit, its input quantity representing the difference between a reference signal and the factored output signal, and wherein the function unit provides integration.

2. Method according to claim 1, wherein an active sensor part (21) is used which contains a temperature-dependent material having a temperature dependency of the optically activity, wherein the optical activity provides a measurement for the temperature prevailing at the temperature-dependent optical element (16) to assess the measurement values.

3. Method according to claim 1, wherein the sensor crystals contained in the active sensor part (21) are penetrated by an individual light beam one after the other in the same crystallographic orientation, and the results of the electro-optical effects on the light beam in the individual crystals are summed, and the sum of the effects of the electro-optical effects in the sensor crystals is available as a basis for determining the present voltage and is applied for this purpose.

4. Method according to claim 1 wherein the partial voltage ($U_1$) dropping over a sensor element (20) is measured and the partial voltage ($U_2$) dropping over at least one further sensor element (20) is measured and the sum of the measured partial voltages is available for determining the total voltage present at the sensor elements and is used for this purpose.

5. Method according to claim 1, wherein the partial voltages $U_1$ to $U_{NSE}$ dropping over a plurality N of sensor elements (20-1, . . . , 20-N) and the sum of the partial voltages from $U_1$ and $U_N$ are available for determining the total voltage U to be measured and are used for this purpose.

6. Method according to claim 1, wherein the voltages $U_{SA,1} \ldots U_{SA,NSA}$ preset at a quantity $N_{SA}$ ($N_{SA}$ is greater than or equal to 1) of active sensor parts (21) are measured, and the sum of the voltages from $U_{SA,1} \ldots U_{SA,NSA}$ is available for determining the voltage U present at the sensor element (20) and used for this purpose.

7. Method according to claim 1, wherein the optical waves transmitted by the sensor element(s) (20) are detected and, as signal I, are each converted to a signal $I_N$ via a component assembly (40) contained in evaluating means (30) in that this signal I comprises an AC component $I_{AC}$ as characteristic quantity which changes over time with the frequency of the voltage to be measured, whose time constant is designated by $T_{AC}$, and the change in the DC component $I_{DC}$ is described as another characteristic quantity of signal I and time constant $T_{DC}$, wherein time constant $T_{DC}$ is appreciably greater than $T_{AC}$ and the scaling is effected by multiplying signal I by a factor K in such a way that the DC component of $I_N$ takes on the predetermined value of a reference signal $V_{ref}$ and factor K which is used in preparation is determined in a closed control loop.

8. Method according to claim 1, wherein the optical waves transmitted by the sensor element(s) (20) are detected and, as signal I, are each converted to a signal $I_N$ via a component assembly (40) contained in the evaluating means (30) in that this signal I comprises an AC component $I_{AC}$ as characteristic quantity which changes over time with the frequency of the voltage to be measured, whose time constant is designated by $T_{AC}$, and the change in the peak value of the signal $I_S$ is described as another characteristic quantity of signal I with time constant $T_S$, wherein time constant $T_S$ is appreciably greater than $T_{AC}$ and the scaling is effected by multiplying signal I by a factor K in such a way that the peak value of $I_N$ takes on the predetermined value of a reference signal $V_{ref}$, and factor K which is used in preparation is determined in a closed control loop.

9. Device for measuring the electrical voltage, wherein the electrical voltage is an alternating quantity, and with at least one light source (31) and at least one optical transmission path (OS), at least one sensor element (20) and evaluating means (30) accompanied by the use of the Pockels effect, wherein the sensor element (s) (20) contain(s) at least one active sensor part (21) comprising at least $N_{SK}$($N_{SK}$ is greater than or equal to zero) electro-optical sensor crystals ($SK_1 \ldots SK_N$) which are penetrated by a polarized measurement light, wherein the evaluating means (30) contain at least one component assembly (40) by means of which scaling is carried out by multiplying the input signal by a factor which is generated by a function unit, its input quantity representing the difference between a reference signal and the factor input signal, and wherein the function unit is an integrator.

10. Device according to claim 9, wherein the an additional optical element (16) follows the electro-optical sensor crystal ($SK_1 \ldots SK_N$) which are penetrated by a polarized measurement light.

11. Device according to claim 10, wherein the electro-optical sensor crystals ($SK_1 \ldots SK_N$) which are penetrated by a polarized measurement light are made of $Bi_4Ge_3O_{12}$.

12. Device according to claim 10, wherein the electro-optical sensor crystals ($SK_1 \ldots SK_N$) which are penetrated by a polarized measurement light are made of $Bi_4Si_3O_{12}$.

13. Device according to claim 10, wherein the electro-optical sensor crystals ($SK_1 \ldots SK_N$) which are penetrated by a polarized measurement light comprise a compound of crystal group 43 m.

14. Device according to claim 10, wherein the optical element (16) is made of $Bi_{12}GeO_{20}$.

15. Device according to claim 10, wherein the optical element (16) is made of $Bi_{12}SiO_{20}$.

16. Device according to claim 10, wherein the optical element (16) comprises a compound of crystal group 23.

17. Device according to claim 9, wherein the active sensor part (21) comprises a plurality of sensor crystals which are directed successively, can be penetrated by an individual light beam and have the same crystallographic orientation.

18. Device according to claim 17, wherein the sensor crystals are enclosed by a spatial structure which is constructed so as to enable the orientation of a plurality of sensor crystals in the direction of transillumination.

19. Device according to claim 18, wherein the spatial structure is constructed so as to carry the sensor crystals externally and the sensor crystals are oriented in the direction of transillumination.

20. Device according to claim 9, wherein, the $N_{SE}$ sensor elements (20) are used ($N_{SE}$ is greater than or equal to one), these sensor elements (20) are arranged in such a way that the partial voltages $U_{SE,1}$ to $U_{SE,NSE}$ drop at these sensor elements (20) and the sum of the partial voltages gives the total voltage U to be measured.

21. Device according to claim 9, wherein the evaluating means (3) contain at least one component assembly (40) by means of which the scaling is carried out by multiplying the input signal by a factor which is generated by a function unit, its input quantity representing the difference between a reference signal and the factored input signal.

22. Device according to claim 9, wherein more than two active sensor parts (21) are used and the quantity of sensor crystals $N_{SK}$ in the active sensor parts may vary.

* * * * *